United States Patent
Divljakovic et al.

(10) Patent No.: US 6,392,419 B1
(45) Date of Patent: *May 21, 2002

(54) APPARATUS FOR AND METHOD OF MONITORING THE STATUS OF THE INSULATION ON THE WIRE IN A WINDING

(75) Inventors: Vojislav Divljakovic, St. Louis; Eric J. Wildi, Ladue, both of MO (US)

(73) Assignee: Emerson Electric Co., St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/550,939

(22) Filed: Apr. 17, 2000

Related U.S. Application Data

(63) Continuation of application No. 08/972,579, filed on Nov. 18, 1997, now Pat. No. 6,087,836.

(51) Int. Cl.[7] .................. H01H 31/12; G01N 27/00; G01R 31/06

(52) U.S. Cl. .................. 324/551; 324/557; 324/547; 324/772

(58) Field of Search .................. 324/557, 243, 324/547, 551, 772, 542, 544, 545, 546; 340/646, 524, 647, 648; 310/68; 326/552

(56) References Cited

U.S. PATENT DOCUMENTS

| | | | |
|---|---|---|---|
| 1,992,013 A | 2/1935 | Palueff |
| 3,539,923 A | 11/1970 | Tsergas |
| 3,564,526 A | 2/1971 | Butts |
| 4,766,387 A | 8/1988 | Browne et al. |
| 5,036,287 A | 7/1991 | Serwatzky |
| 5,252,927 A | 10/1993 | Bruhlmeier et al. |

FOREIGN PATENT DOCUMENTS

| | | |
|---|---|---|
| DE | 2614637 | 10/1976 |
| DE | 3405225 | 8/1984 |
| EP | 0437214 | 7/1991 |
| FR | 2437628 | 4/1980 |

*Primary Examiner*—N. Le
*Assistant Examiner*—Wasseem H. Hamdan
(74) *Attorney, Agent, or Firm*—Harness Dickey & Pierce PLC

(57) ABSTRACT

An apparatus for monitoring the status of the insulation on the wire in a winding in a device comprises a surrogate sample of insulating material having a thickness and properties selected to fail before the failure of the insulation on the wires in the winding, and a detector for detecting and indicating failure of the sample of insulating material. A method of monitoring the status of the insulation on the winding in a dynamoelectric device includes associating a surrogate sample of insulating material with the winding, monitoring the surrogate sample, and providing an alarm when the surrogate sample fails, which is predictive of the failure of the insulation on the winding wire.

7 Claims, 3 Drawing Sheets

APPARATUS FOR AND METHOD OF MONITORING THE STATUS OF THE INSULATION ON THE WIRE IN A WINDING

This application is a continuation of Ser. No. 08/972,579 filed Nov. 18, 1997, U.S. Pat. No. 6,087,836.

FIELD OF THE INVENTION

This invention relates to a sensors for coil wound devices, and in particular to a sensor for monitoring the status of the insulation on the wire in a coil winding.

BACKGROUND OF THE INVENTION

There are a number of systems where the continued operation of a coil wound device, such as an electric motor or transformer is critical. For example, in an assembly line, an unanticipated failure of the electric motor results in the shut-down of the entire system. In these applications it would be desirable to have a warning of the imminent failure of the coil so that it could be replaced during a scheduled maintenance period for the device, rather than during operating time. One of the principle causes of coil failure is the failure of the insulation on the wire in windings. Over time, heat and vibration cause the electric insulation on the winding wire to break down, resulting in a short-circuiting of the winding.

Various attempts have been made to check or test the status of the insulation on windings. Most of these efforts focus on periodically applying a test voltage to the winding and measuring for leakage indicative of failed insulation. See, e.g., Horvath et al., U.S. Pat. No. 4,540,922, and Zelm, U.S. Pat. Nos. 5,155,441 and 5,172,289. However these methods usually require that the motor be taken out of service. Other efforts involved measuring the field properties of the winding, e.g. Palueff, U.S. Pat. No. 1,992,013 and Miller et al., U.S. Pat. No. 5,032,826, or measuring the motor operating variables, e.g., Kueck et al., U.S. Pat. No. 5,612,601. Still other efforts involved predicting failure by tracking the operating time and temperature of the motor, e.g., Chu et al, U.S. Pat. No. 5,019,760. Finally, sensing devices can be incorporated into the winding wire itself, e.g. Tokuda et al., U.S. Pat. No. 4,737,775. However, this could add significantly to the cost of the motor, and might affect operation of the motor.

SUMMARY OF THE INVENTION

The present invention relates to an apparatus for, and a method of, monitoring the status of the insulation on the wire in a winding, such as the winding of an electric motor, electric generator, or an electric transformer. Generally, the apparatus comprises a surrogate sample of insulating material having a thickness and properties selected to fail before the failure of the insulation on the wire in the winding, and a detector for detecting and indicating failure of the sample of insulating material. In the preferred embodiment, the detector comprises first and second contacts, preferably first and second wires twisted together, and the surrogate sample is preferably a layer of insulation on one or both wires. The detector measures conduction between the wires which indicates failure of the surrogate sample of insulating material.

The surrogate sample is preferably the same material as the insulation on the winding wire, but is thinner than the insulation on the winding wire so that it will fail before the insulation on the winding wire fails. The surrogate sample may be entirely on one of the wire contacts, or it may be on both wire contacts. The surrogate sample is associated with the winding, i.e. it is positioned relative to the winding that it encounters substantially the same environmental conditions as the winding. The surrogate sample is preferably embedded in the winding itself, but it could be positioned external of the winding.

According to the method of this invention, the surrogate sample of insulating material is associated with the winding in a dynamoelectric device such as a motor or generator, or in a transformer, and the sample is monitored. This is conveniently done by incorporating the sample into a probe that also includes first and second contacts. When the surrogate sample of insulation fails, as indicated by conduction between the first and second contacts, it indicates that failure of the winding is likely to occur. The device can then be repaired or replaced before an actual breakdown of the coil occurs.

The apparatus and method of the present invention allow continuous monitoring of the condition of the insulation on the wire in a winding without the need to take the winding out of service for testing. The apparatus and method employ a surrogate sample of insulating material so they do not interfere with the normal construction and assembly of the device in which they are incorporated. However, because the sample is associated with the winding, it provides an accurate representation of the condition of the insulation on the winding wire, rather than a prediction. The apparatus and method measure the insulating property of the surrogate sample—the critical property of the insulation on the winding wire, rather than secondary effects such as changes in the winding field properties which are only evident after the breakdown has begun, and thus the apparatus and method of the present invention provide a more reliable advance notice of winding failure. These and other features and advantages will be in part apparent and in part pointed out hereinafter.

DETAILED DESCRIPTION OF THE PREFERRED EMBODIMENTS

Figure 1:
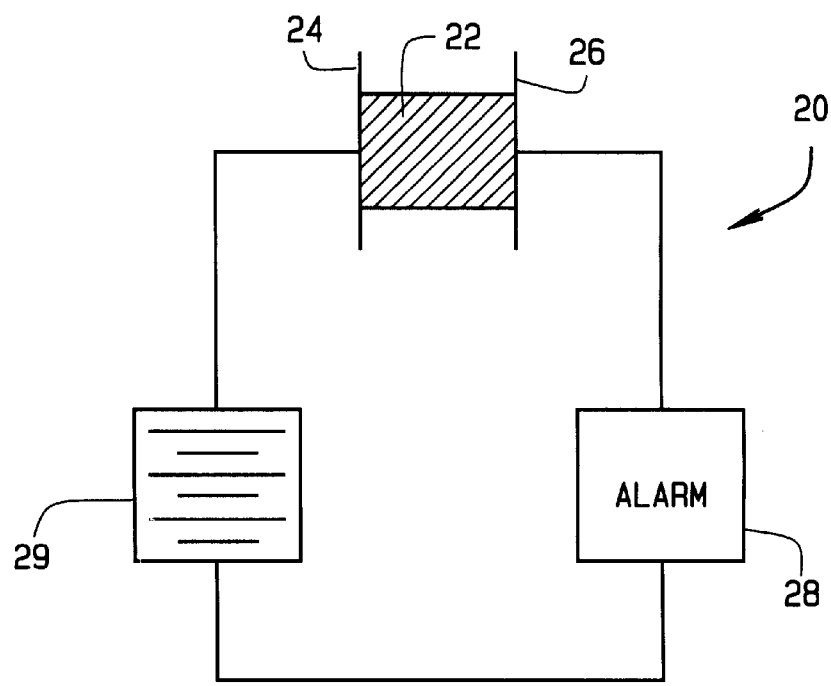
FIG. 1 is a schematic view of an apparatus for monitoring the status of the insulation on the wire in a winding, constructed according to the principles of a first embodiment this invention.
Figure 2:
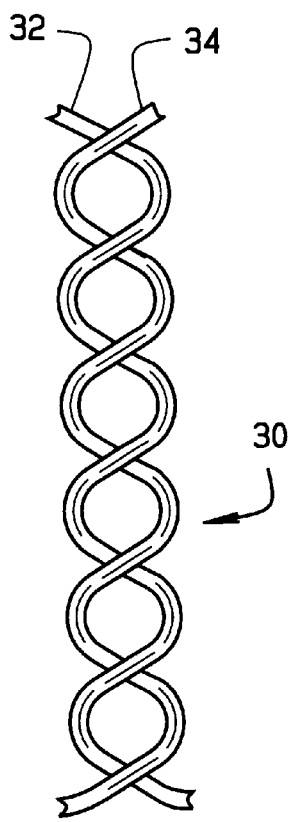
FIG. 2 is a perspective view of a twisted wire probe adapted forge in the apparatus.

An apparatus 20 for monitoring the status of the insulation on the wire in a winding is shown schematically in FIG. 1. The apparatus can be incorporated into any device that has a coil with an insulated wire winding, such as a motor, a generator, or transformer. While in this description the apparatus is described with reference to electric motors or other dynamoelectric devices, the invention is not so limited. The apparatus 20 comprises a surrogate sample 22 of insulation. This sample is selected to have physical properties to fail before the failure of the insulation on the winding wire, when exposed to the same general environmental conditions. Preferably, the surrogate sample is the same material as the insulation on the wire, but is thinner so that it will fail under the same conditions and at a similar rate as the insulation on the wire, but will do so sooner because it is thinner. Thus the surrogate sample provides accurate representation of the status of the insulation on the winding wire.

The apparatus 20 also comprises a detector for detecting failure of the surrogate sample. The detector preferably comprises first and second contacts 24 and 26 that are separated by the surrogate sample 22. The failure of the surrogate sample 22 is detected when the sample allows conduction between the first and second contacts 24 and 26. Breakdown of the electrical resistance is what causes the short circuiting and failure of the winding.

The detector also includes an alarm 28, either an audible alarm, such as a bell or buzzer, or more preferably a visual alarm, such as in LED indicator, that the surrogate sample has failed. This is indicative that the insulation on the winding is about to fail, and corrective action should be taken. The circuit preferably includes a power supply 29 for powering the alarm 28.

Figure 3:
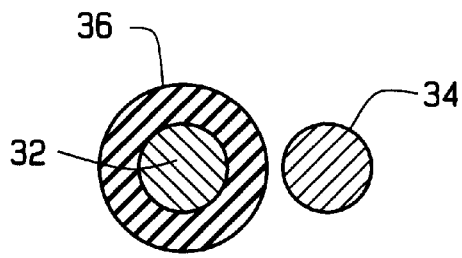
FIG. 3 is a cross-sectional view of a first alternate construction of a twisted wire probe for use in the apparatus.
Figure 4:
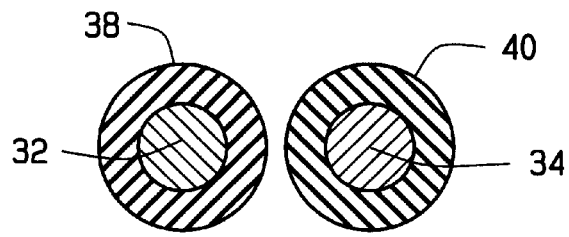
FIG. 4 is a cross-sectional view of a second alternate construction of a twisted wire probe for use in the apparatus.

The surrogate sample 22 and the first and second contacts 24 and 26 are preferably implemented in the form of probe 30, comprising a pair of twisted wire contacts 32 and 34. The surrogate sample 22 is provided as a layer of insulation on at least one of the wire contacts 32 and 34. In a first alternate construction, shown in FIG. 3, the surrogate sample comprises a layer 36 of insulation on the first wire contact 32, and the second wire contact 34 is bare. In this construction the layer 36 is preferably the same material as the insulation on the winding wire, but is thinner than the insulation on the winding wire. For example, the insulation might be 50% of the thickness of the insulation on the winding wire. In a second alternate construction, shown in FIG. 4, the surrogate sample comprises a layer 38 on the first wire contact 32 and a layer 40 on the second wire contact 34. It is preferable to have at least some insulation on each wire, because in the instance where one of the wires is bare, there is a greater chance that a small pin hole or a small manufacturing defect in the insulation on the insulated wire might contact the bare wire, giving rise to a false indication that the insulation has failed. In this construction the layers 38 and 40 are preferably the same material as the insulation on the winding wire, and the total thickness of the two layers is less than the thickness of the insulation on the winding wire. For example, the total thickness of the insulation might be 50% of the thickness of the insulation on the winding wire.

Figure 5:
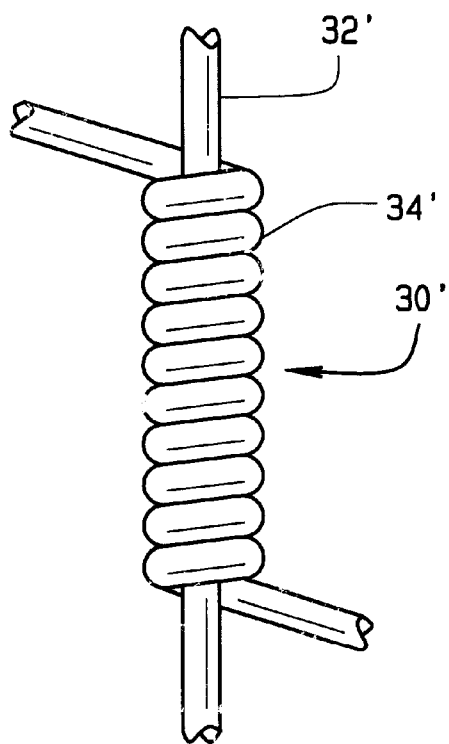
FIG. 5 is a perspective view of an alternate construction of a twisted wire probe adapted for use in the apparatus.

As shown in FIG. 5, an alternate embodiment of the twisted wire probe, indicated generally as 30', comprises a generally straight wire 32' and a wire 34' wrapped around the generally straight wire 32'. As with the wire 32 and 34 in the probe 30, one of the wires 32' and 34' could be bare, and the other of the wires could have a layer of insulation thinner than the insulation on the winding wire. Alternatively both the wires 32' and 34' can have a layer of insulation thereon, and the total thickness of the insulation is less than the thickness on the winding wire.

Figure 6:
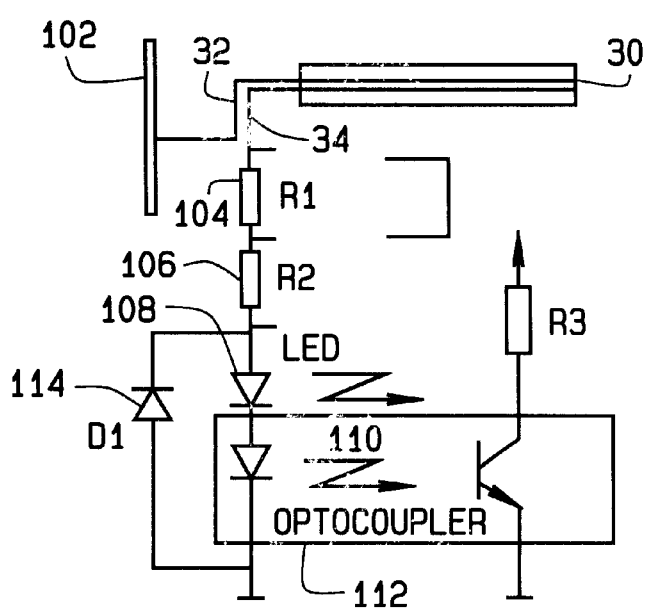
FIG. 6 is a schematic view of a detection circuit constructed according to the principles of this invention.
Figure 7:
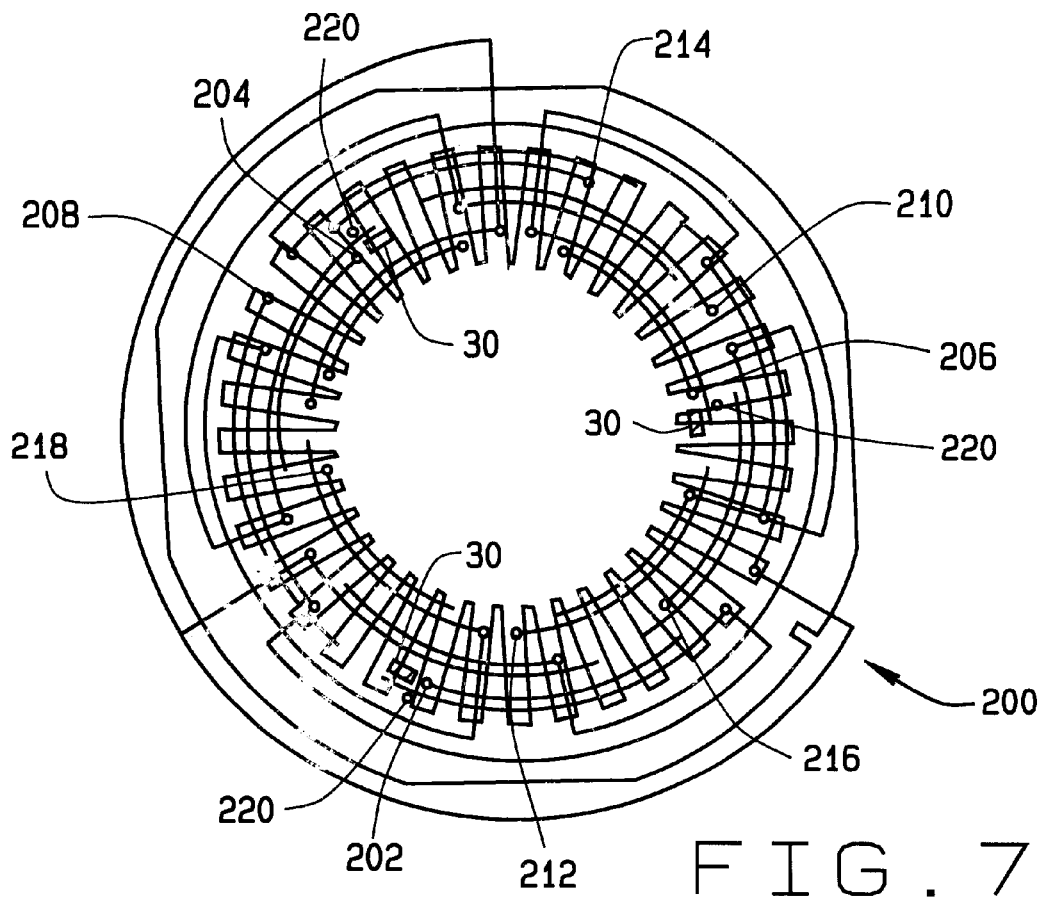
FIG. 7 is a schematic view of a motor stator incorporating propes in accordance with this invention.

As shown in FIG. 7, the probe 30 (or 30') is preferably connected in parallel to the power lines so that the probe experiences the highest voltage in the winding. FIG. 7 shows the windings of a three-phase motor 200. The windings have terminals 202, 204, 206, 208, 210, 212, 214, 216, and 218. Terminals 202, 204, and 206 are each connected to a power supply. As shown in the Figure, one of the leads from a probe 30 (or probe 30') is connected to each of the terminals 202, 204, and 206. The other of the leads 220 from each of the probes 30 are connected to detection circuits, such as the circuit in FIG. 6. The remainder of the terminals 208, 210, 212, 214, 216, and 218 are connected to each other, as is known in the art, depending upon whether the motor in intended to operate at low or high voltages. This distribution of probes 30 ensures that probes are distributed around the circumference of the winding 200, and also ensures that probes are positioned at different radial positions to monitor conditions at different positions within the winding.

Figure 8:
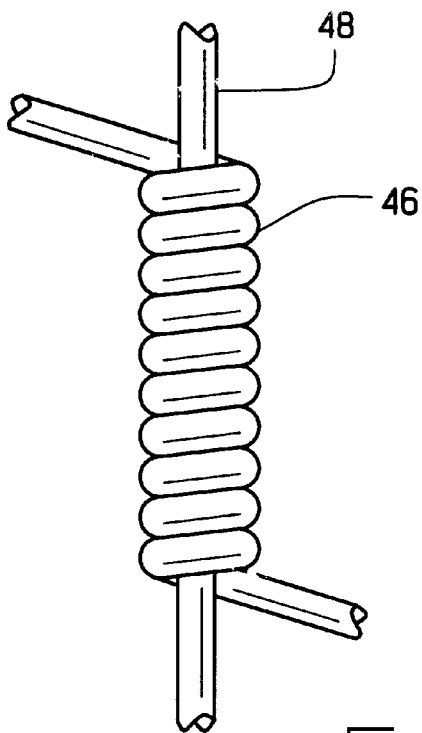
FIG. 8 is a perspective view of a second embodiment of this invention in which a probe wire is wound around one of the wires in a coil.

It is also possible to monitor the insulation of the winding directly, rather that through a surrogate. In this instance, as shown in FIG. 8, a single probe wire 46 is wrapped around one of the insulated winding wires 48 in a coil. The probe wire 46 is preferably wrapped around the wire at the start or end of the winding where the voltage is the greatest. The probe wire 46 can be uninsulated, but preferably has at least a thin coating of insulation so that pin holes or other defects in the insulation on the winding wire 48 do not cause an electrical contact between the probe wire 46 and the winding wire 48, falsely indicating that the insulation has failed. As the insulation on the wires 46 and 48 degrades, electrical contact is eventually made between the wires, which can trigger an alarm or signal connected to the probe wire 46. The insulation on the probe wire 46 is preferably thinner or of a different composition than the insulation on the winding motor, so that electrical contact between the probe wire 46 and the winding wire 48 is predictive of failure of the insulation in the winding generally.

According to the method of this invention, the surrogate sample 22, preferably as part of a probe 30 is associated with the winding. This means that the surrogate sample is positioned where it will be exposed to essentially the same environment as the winding. The construction of the probe 30 is such that it can actually be incorporated into the winding, so that the surrogate sample 22 encounters the exact same environment as the insulation on the winding. However the probe could be applied to the exterior of the winding, or elsewhere, for example within the housing for the motor, generator, or transformer. One or more probes may be installed where insulation failures are most frequent, i.e. in those areas with the highest temperature rise, vibration, voltage stress, or environmental exposure.

The condition of the surrogate sample is monitored, preferably by measuring the resistivity/conductivity of the sample. When the surrogate sample breaks down sufficiently to allow conduction between the first and second contacts, it is indicative that the insulation on the winding wire is similarly about to fail. Multiple probes 30 could be provided with different insulation thicknesses so that the progress of the degradation can be monitored.

The apparatus and the method of the present invention thus provide accurate monitoring of the condition of the insulation on a winding wire in a device such as a motor, a generator, or a transformer. The apparatus and method do not interfere with the normal construction and operation of the device, by utilizing a surrogate sample that is exposed to substantially the same environment as the winding, and measuring the resistivity/conductivity of the sample, the very property that results in failure of the winding is utilized.

FIG. 6 is a schematic diagram of a detection circuit 100 constructed according to the principles of this invention. The detection circuit 100 includes a probe 30. The first wire contact 32 of the probe 30 is connected to the line voltage 102, and the second wire contact 34 of the probe is connected to resistors 104 and 106, and then to LED 108 and LED 110 in an optocoupler 112. The two resistors 104 and 106 are used to accommodate different values of line voltages, and one of the resistors can be by-passed to achieve the appropriate resistance for the voltage of the line to which the probe 30 is connected. The resistors 104 and 106 are selected so that the current through the circuit causes the LED's 108 and 110 to emit light, but so that at the peak value of the line voltage the current does not exceed the maximum rated current for the LED's.

The output of the optocoupler 112 provides a square wave pulse train that can be used as the signal indicating the failure of the insulation, and communicated to a signal acquisition system.

What is claimed is:

1. In combination with a device having a winding of insulated wire, an apparatus for monitoring the condition of the electric insulation on the winding wire, the apparatus comprising a probe associated with the winding so that it encounters substantially the same environmental conditions as the winding and adapted to detect the thickness of the insulation on the insulated wire, and an alarm, connected to the probe for generating a signal predictive of failure of the insulation on the winding based on the thickness of the insulation detected by the probe.

2. The combination according to claim 1 wherein the alarm includes a visual indicator.

3. The combination according to claim 1 wherein the alarm includes an audible indicator.

4. The combination according to claim 1 wherein the probe is positioned within the winding.

5. The combination according to claim 1 wherein the probe is positioned external of the winding.

6. In combination with a device having a winding of insulated wire, a probe in contact with the winding for monitoring the condition of the electric insulation on the wire in the winding, and a detector for detecting electrical conduction between the winding and the probe which indicates failure of the insulation on the winding wire.

7. In combination with a device having a winding of insulated wire, an apparatus for monitoring the condition of the electric insulation on the winding wire, the apparatus comprising as a probe associated with the winding so that it encounters substantially the same environmental conditions as the winding and adapted to make electrical contact with the winding wire through defects in the electrical insulation, and an alarm, connected to the probe for generating a signal predictive of failure of the insulation on the winding when the probe makes electrical contact with the winding wire.

* * * * *